US010340240B2

(12) United States Patent
Chen et al.

(10) Patent No.: US 10,340,240 B2
(45) Date of Patent: Jul. 2, 2019

(54) MECHANISMS FOR FORMING POST-PASSIVATION INTERCONNECT STRUCTURE (71) Applicant: Taiwan Semiconductor Manufacturing Company, Ltd., Hsinchu (TW)

(72) Inventors: Ying-Ju Chen, Tuku Township (TW); Hsien-Wei Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 25 days.

(21) Appl. No.: 15/470,341

(22) Filed: Mar. 27, 2017

(65) Prior Publication Data

US 2017/0200687 A1 Jul. 13, 2017

Related U.S. Application Data (63) Continuation of application No. 14/082,997, filed on Nov. 18, 2013, now Pat. No. 9,620,469.

(51) Int. Cl.
*H01L 23/00* (2006.01)
*H01L 23/31* (2006.01)
(Continued)

(52) U.S. Cl.
CPC .......... *H01L 24/13* (2013.01); *H01L 23/3157* (2013.01); *H01L 23/5329* (2013.01);
(Continued)

(58) Field of Classification Search
CPC ......... H01L 24/03; H01L 24/05; H01L 24/11; H01L 24/13; H01L 2224/03912; H01L 2224/11912; H01L 2224/13022; H01L 2924/014; H01L 2224/1357; H01L 2224/13655; H01L 2224/13147; H01L 2224/02331; H01L 2224/13562; H01L 2224/13563; H01L 2224/13564; H01L 24/10–17; H01L 224/10–13023;
(Continued)

(56) References Cited

U.S. PATENT DOCUMENTS

5,906,312 A 5/1999 Zakel et al.
6,283,359 B1 9/2001 Brofman et al.
(Continued)

*Primary Examiner* — Allen L Parker
*Assistant Examiner* — Pauline Vu
(74) *Attorney, Agent, or Firm* — Slater Matsil, LLP (57) ABSTRACT Mechanisms for forming a semiconductor device are provided. The semiconductor device includes a contact pad over a substrate. The semiconductor device also includes a passivation layer over the substrate and a first portion of the contact pad, and a second portion of the contact pad is exposed through an opening. The semiconductor device further includes a post-passivation interconnect layer over the passivation layer and coupled to the second portion of the contact pad. In addition, the semiconductor device includes a bump over the post-passivation interconnect layer and outside of the opening. The semiconductor device also includes a diffusion barrier layer physically insulating the bump from the post-passivation interconnect layer while electrically connecting the bump to the post-passivation interconnect layer.

19 Claims, 10 Drawing Sheets (51) Int. Cl.
    *H01L 21/768* (2006.01)
    *H01L 23/532* (2006.01)
    *H01L 23/522* (2006.01)
    *H01L 23/525* (2006.01)

(52) U.S. Cl.
    CPC ........ *H01L 23/53238* (2013.01); *H01L 24/03* (2013.01); *H01L 24/05* (2013.01); *H01L 24/11* (2013.01); *H01L 23/3114* (2013.01); *H01L 23/525* (2013.01); *H01L 2224/02311* (2013.01); *H01L 2224/02331* (2013.01); *H01L 2224/02372* (2013.01); *H01L 2224/02381* (2013.01); *H01L 2224/0345* (2013.01); *H01L 2224/0347* (2013.01); *H01L 2224/03452* (2013.01); *H01L 2224/03462* (2013.01); *H01L 2224/03464* (2013.01); *H01L 2224/03912* (2013.01); *H01L 2224/0401* (2013.01); *H01L 2224/05008* (2013.01); *H01L 2224/05022* (2013.01); *H01L 2224/05027* (2013.01); *H01L 2224/05124* (2013.01); *H01L 2224/05147* (2013.01); *H01L 2224/05166* (2013.01); *H01L 2224/05186* (2013.01); *H01L 2224/05569* (2013.01); *H01L 2224/05583* (2013.01); *H01L 2224/05655* (2013.01); *H01L 2224/05681* (2013.01); *H01L 2224/05686* (2013.01); *H01L 2224/11* (2013.01); *H01L 2224/1191* (2013.01); *H01L 2224/11334* (2013.01); *H01L 2224/11826* (2013.01); *H01L 2224/11912* (2013.01); *H01L 2224/13022* (2013.01); *H01L 2224/13024* (2013.01); *H01L 2224/1357* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/13561* (2013.01); *H01L 2224/13611* (2013.01); *H01L 2224/13613* (2013.01); *H01L 2224/13616* (2013.01); *H01L 2224/13639* (2013.01); *H01L 2224/13647* (2013.01); *H01L 2224/13655* (2013.01); *H01L 2224/13681* (2013.01); *H01L 2224/13686* (2013.01); *H01L 2924/014* (2013.01); *H01L 2924/181* (2013.01)

(58) Field of Classification Search
    CPC ............... H01L 2224/13561–13566; H01L 2224/023–02331; H01L 2224/05008; H01L 2224/13024; H01L 2224/05569
    See application file for complete search history.

(56) References Cited

U.S. PATENT DOCUMENTS

| | | | |
|---|---|---|---|
| 6,337,445 B1 | 1/2002 | Abbott et al. | |
| 7,700,476 B2 * | 4/2010 | Suh | H01L 24/13 257/772 |
| 7,829,453 B2 | 11/2010 | Jungnickel et al. | |
| 8,058,726 B1 | 11/2011 | Jin et al. | |
| 8,701,281 B2 | 4/2014 | Sidhu et al. | |
| 2002/0020855 A1 | 2/2002 | Hwang | |
| 2002/0025585 A1 | 2/2002 | Lam et al. | |
| 2003/0164552 A1 | 9/2003 | Tong et al. | |
| 2004/0065949 A1 | 4/2004 | Chen et al. | |
| 2004/0115340 A1 | 6/2004 | Griego | |
| 2005/0062169 A1 | 3/2005 | Dubin et al. | |
| 2005/0087885 A1 | 4/2005 | Jeong | |
| 2005/0167799 A1 | 8/2005 | Doan | |
| 2005/0205993 A1 | 9/2005 | Yamaguchi | |
| 2006/0204650 A1 | 9/2006 | Hu | |
| 2007/0028445 A1 | 2/2007 | Su et al. | |
| 2007/0045869 A1 | 3/2007 | Ho et al. | |
| 2007/0075410 A1 | 4/2007 | Chan et al. | |
| 2007/0252275 A1 | 11/2007 | Huang et al. | |
| 2008/0308935 A1 * | 12/2008 | Kim | H01L 21/565 257/738 |
| 2009/0014869 A1 | 1/2009 | Vrtis et al. | |
| 2009/0174071 A1 | 7/2009 | Chao et al. | |
| 2010/0013100 A1 | 1/2010 | Xiao et al. | |
| 2010/0096754 A1 | 4/2010 | Lee et al. | |
| 2010/0155115 A1 | 6/2010 | Pang et al. | |
| 2011/0304029 A1 | 12/2011 | Sogawa et al. | |
| 2012/0018878 A1 * | 1/2012 | Cheng | H01L 21/4853 257/737 |
| 2013/0009307 A1 * | 1/2013 | Lu | H01L 24/13 257/738 |
| 2013/0075907 A1 | 3/2013 | Pang | |
| 2013/0147031 A1 | 6/2013 | Chen et al. | |
| 2013/0193570 A1 | 8/2013 | Kuo et al. | |

* cited by examiner

MECHANISMS FOR FORMING POST-PASSIVATION INTERCONNECT STRUCTURE

PRIORITY CLAIM AND CROSS-REFERENCE

This application claims the benefit to and is a continuation of U.S. patent application Ser. No. 14/082,997, filed on Nov. 18, 2013, and entitled "Mechanisms for Forming Post-Passivation Interconnect Structure," which application is incorporated herein by reference.

BACKGROUND

The packaging of integrated circuit (IC) chips is one important step in the manufacturing process. The packaging of an IC chip has two main purposes: to protect delicate semiconductor chips, and to connect interior integrated circuits to exterior connections. As semiconductor devices reach higher levels of integration, especially for 3D IC technology, packaging of an IC chip accounts for a considerable portion of the cost of producing the device, and failure of the package leads to costly yield reduction.

Several packaging technologies are available. For example, a wire bonding technology uses upward-facing chips with wires connected to each pad on the chip. In flip chip technology, a flip chip microelectronic assembly includes a direct electrical connection of a downward-facing (that is "flipped") chip onto an interposer or a substrate, using solder bumps as interconnects. The use of flip chip packaging has dramatically grown as a result of the advantages in size, performance, flexibility, reliability, and cost over other packaging methods.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional steps can be provided before, during, and after the method, and some of the steps described can be replaced or eliminated for other embodiments of the method.

Flip chips may be made by placing one or more solder bumps on a chip. A post-passivation interconnect (hereinafter referred to as PPI) layer, which is formed of a conductive material, is formed under the solder bump and extending to connect to other components in the chip. It has been discovered that the conductive material of the PPI layer may diffuse to the solder bumps and react with the solder material, forming intermetallic compounds. As such, voids may be formed, and a thickness of the PPI layer is decreased. The diffusion circumstance is particularly serious at a current crowding site. For example, the current crowding site is oftentimes at or adjacent to corners of the solder bump and an interface of the solder bump and the PPI layer. The formation of the voids and the reduced thickness of the PPI layer may increase risks of bump crack and an interruption of the PPI layer. In addition, the formation of the intermetallic compound may also reduce the conductivity of the solder bump.

Figure 1A:
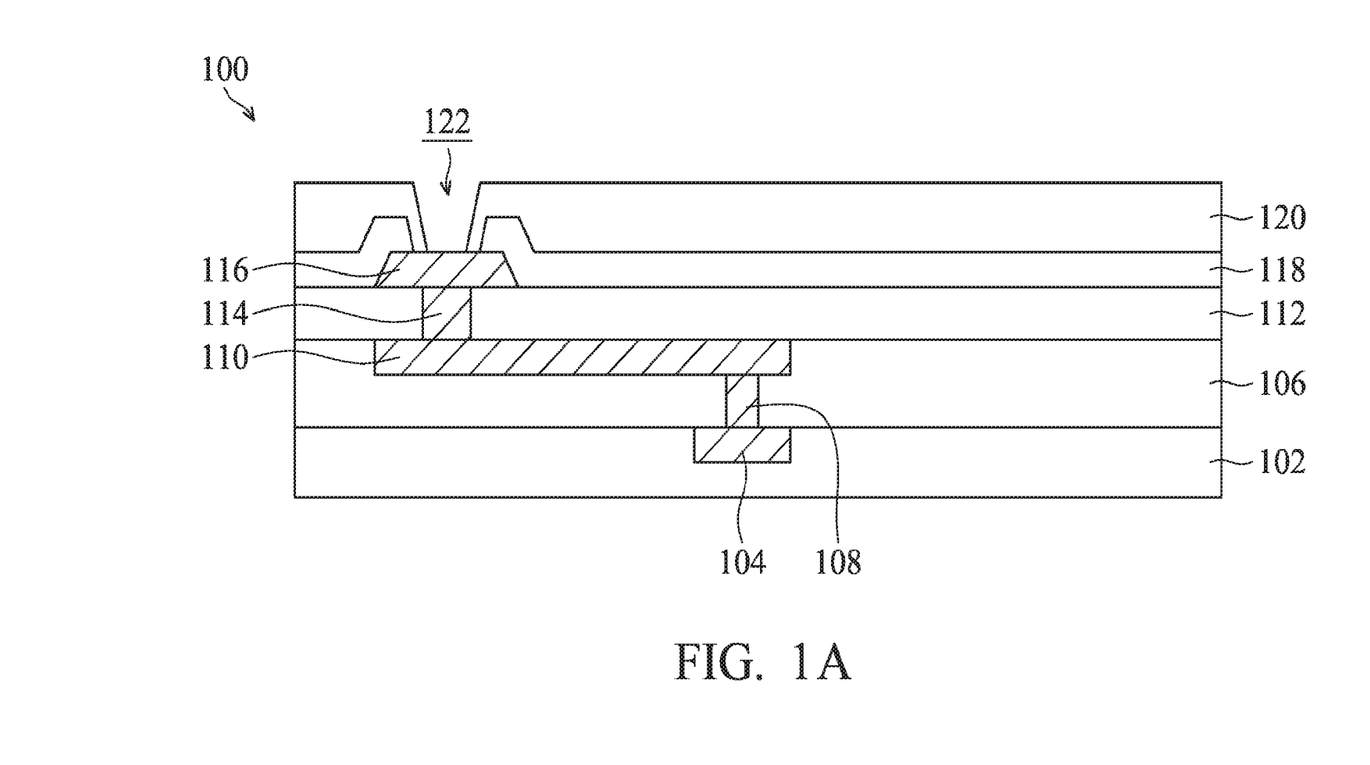
FIG. 1A-1G illustrate cross-sectional views of a semiconductor device at various stages of manufacturing, in accordance with some embodiments.

FIGS. 1A-1G illustrate cross-sectional views of a semiconductor device at various stages of manufacturing processes, in accordance with some embodiments. Referring to FIG. 1A, a substrate 102 is provided. The substrate 102 may be a semiconductor substrate including silicon. Alternatively, the substrate 102 may include other types of bulk semiconductor material or other materials. For example, the substrate 102 may be silicon-on-insulator (SOI), silicon carbide, III-V materials or sapphire. The substrate 102 may further include a variety of electrical circuits 104. The electrical circuits 104 may be any type of circuitry suitable for a particular application. In certain embodiments, the electrical circuits 104 may include various n-type metal-oxide semiconductor (NMOS) and/or p-type metal-oxide semiconductor (PMOS) devices made using high-k dielectric materials including hafnium silicate, zirconium silicate, hafnium oxide, and zirconium oxide, or using multiple gate transistor designs such as fin field effect transistor (FinFET). The electrical circuits 104 may be interconnected to perform one or more functions. The functions include memory structures, memory structures, processing structures, sensors, amplifiers, power distribution, input/output circuitry or the like.

An interlayer dielectric 106 is formed on the substrate 102. The interlayer dielectric 106 may be formed of low-k dielectric materials with a k-value lower than about 3.9. For example, the low-k dielectric materials include fluorine-doped silicon oxide, carbon-doped silicon oxide, porous silicon oxide, porous carbon-doped silicon oxide, organic polymers, silicone based polymers, or a combination thereof. The interlayer dielectric 106 may be deposited by chemical vapor deposition (CVD), plasma enhanced chemical vapor deposition (PECVD), metallorganic chemical vapor deposition (MOCVD), physical vapor deposition (PVD), atomic layer deposition (ALD), a spin-on-dielectric (SOD) process, the like, or a combination thereof.

A plug 108 is formed of a metal, which may be titanium, titanium nitride, tungsten, aluminum, tantalum, titanium nitride, or combinations thereof, in an interlayer dielectric 106 and is coupled to the electric circuits 104. The plug 108 is coupled to a bottom metallization layer 110, which is formed of copper, aluminum, tantalum, titanium, titanium nitride, tungsten, alloys thereof, or combinations thereof, and disposed in the interlayer dielectric 106. Another interlayer dielectric 112 is over the bottom metallization layer 110 and is formed of low-k dielectric materials similar to those discussed with respect to the interlayer dielectric 106. A top plug 114 is in the interlayer dielectric 112 and is electrically connected to the bottom metallization layer 110. The top plug 114 is formed of a metal, which may be tungsten, copper, titanium nitride, tantalum, aluminum, or an alloy thereof. A top metallization layer formed as a contact pad 116 is coupled to the top plug 114. The contact pad 116 may be formed of copper, aluminum, titanium, titanium nitride, tungsten, alloys thereof, or combinations thereof. While FIG. 1A shows the bottom metallization layer 110 and the top metallization layer (e.g., the contact pad 116), one or more interlayer dielectrics layers (not shown), and the associated plug and metallization layer (not shown) may be formed between the bottom metallization layer 110 and the top metallization layer.

One or more passivation layers, such as a passivation layer 118, are formed and patterned over the contact pad 116. In some embodiments, the passivation layer 118 is formed of non-organic materials such as un-doped silicate glass, silicon nitride, silicon oxide, silicon oxynitride, boron-doped silicon oxide, phosphorous-doped silicon oxide or the like. The passivation layer 118 is formed to cover a peripheral region of the contact pad 116. The passivation layer 118 may be a single layer or a laminated layer. In FIG. 1, a single layer of the passivation layer 118 is shown for illustrative purpose only. As such, other embodiments may include any number of passivation layers.

A polymer layer 120 is deposited and patterned over the passivation layer 118. The polymer layer 120 may cover the peripheral region of the contact pad 116. In some embodiments, a center portion of the contact pad 116 is exposed through an opening 122. The polymer layer 120 may be formed of polymer materials such as polyimide, epoxy, polybenzoxazole (PBO), or the like, although other relatively soft, often organic, dielectric materials can also be used. The polymer layer 120 may be deposited by any suitable method such as spin coating or other methods. The polymer layer 120 may have a thickness ranging from about 1 μm to about 10 μm.

Figure 1B:
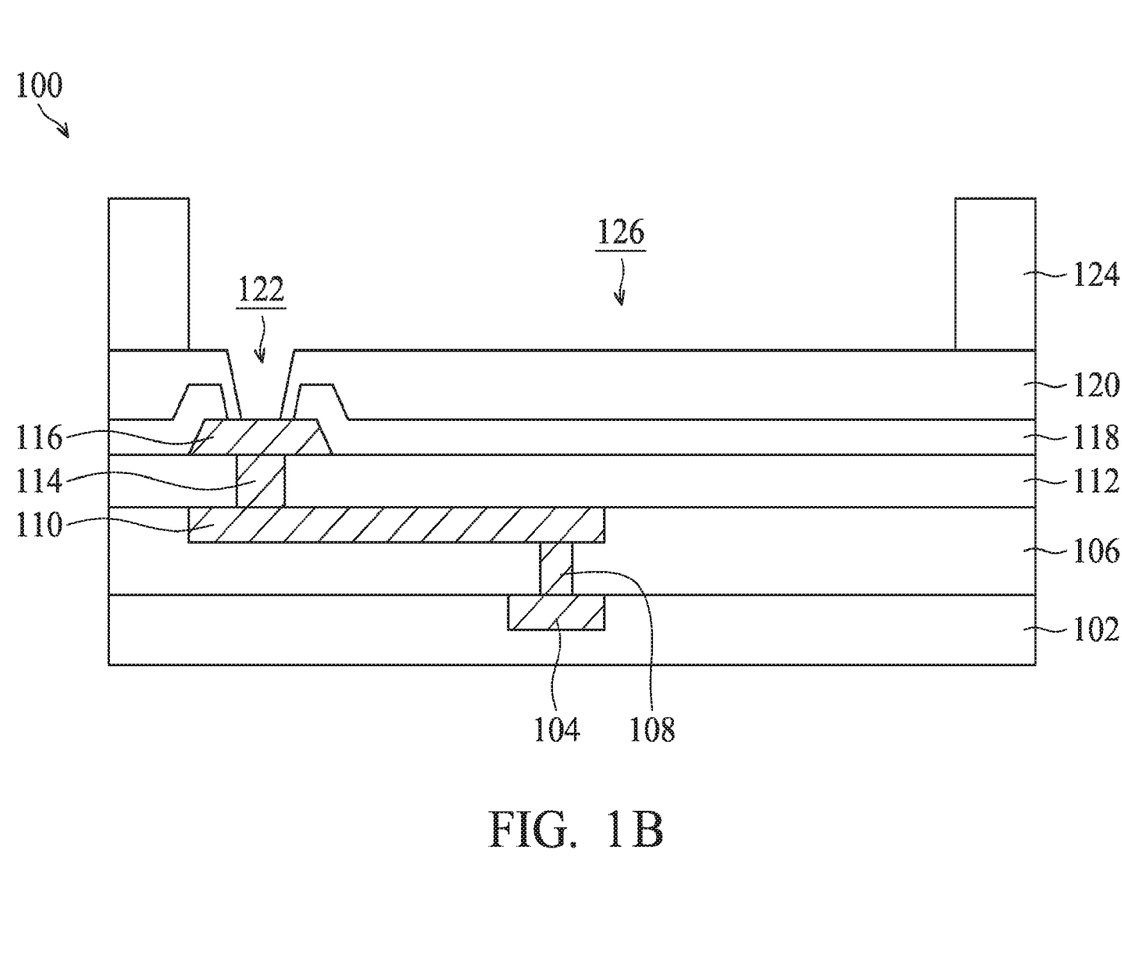

Afterwards, referring to FIG. 1B, a photoresist 124 is formed over the polymer layer 120. The photoresist 124 is patterned to have an opening 126 exposing a portion of the polymer layer 120 adjacent to the opening 122, by using a photolithography process. The opening 126 may be positioned over the opening 122 and have a diameter greater than that of the opening 122. The contact pad 116 is exposed through the openings 122 and 126.

Figure 1C:
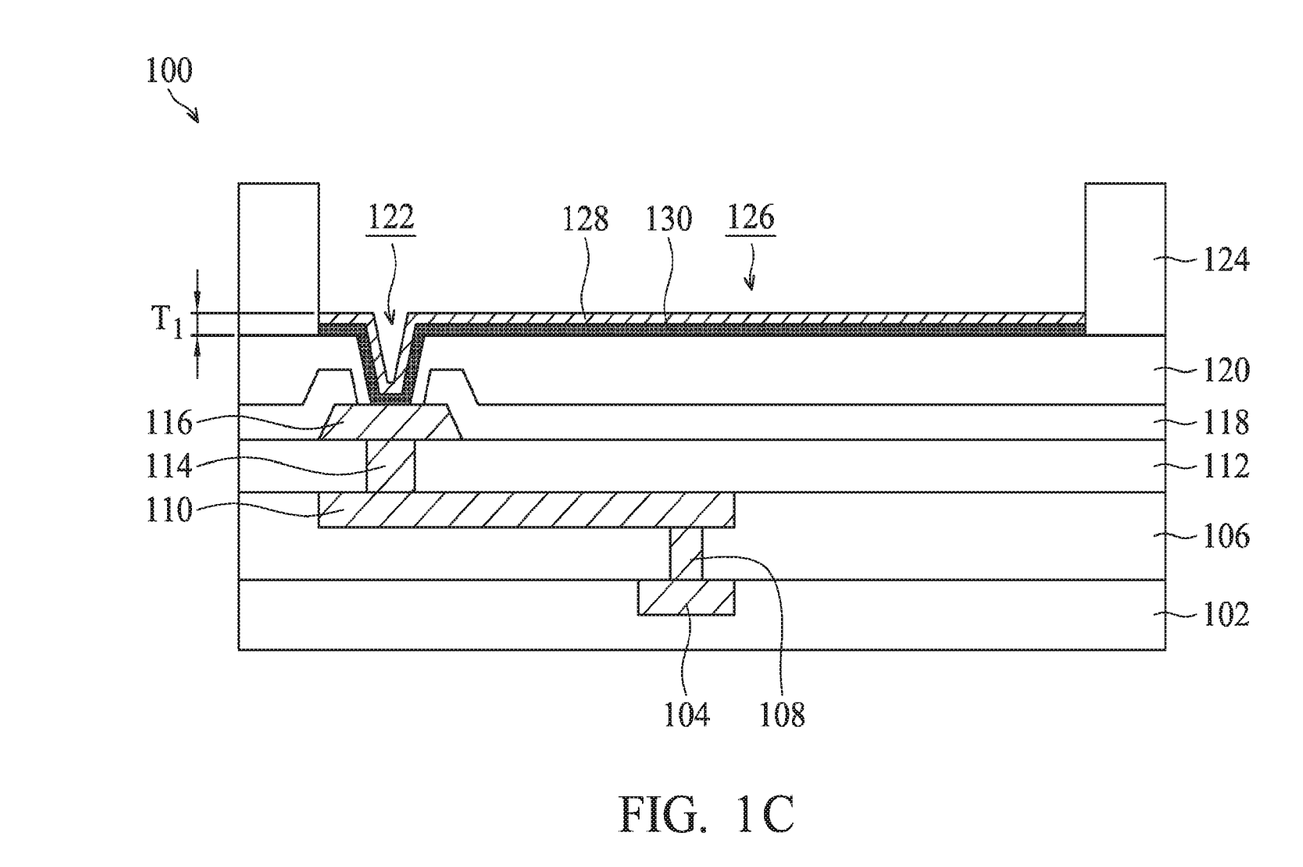

Referring to FIG. 1C, a post-passivation interconnect (PPI) layer (hereinafter referred as to PPI layer) 128 is deposited over the polymer layer 120 and coupled to the exposed portion of the contact pad 116. The PPI layer 128 may function as redistribution lines, power lines, inductors, capacitors or any passive components. In some embodiments, the PPI layer 128 is a redistribution layer while providing the function of preventing underlying components being attacked by moisture. The PPI layer 128 may include a conductive material, such as copper, aluminum, copper alloy, or other mobile conductive materials. The PPI layer 128 may be formed by plating, electroless plating, sputtering, chemical vapor deposition, or the like. In some embodiments, the PPI layer 128 is a copper layer or a copper alloy layer, and a seed layer 130 may be formed prior to the PPI layer 128. The seed layer 130 can be constructed as a portion of the PPI layer 128. In some embodiments, the PPI layer 128, including the seed layer 130, has a thickness $T_1$ ranging from about 2 μm to about 15 μm.

Figure 1D:
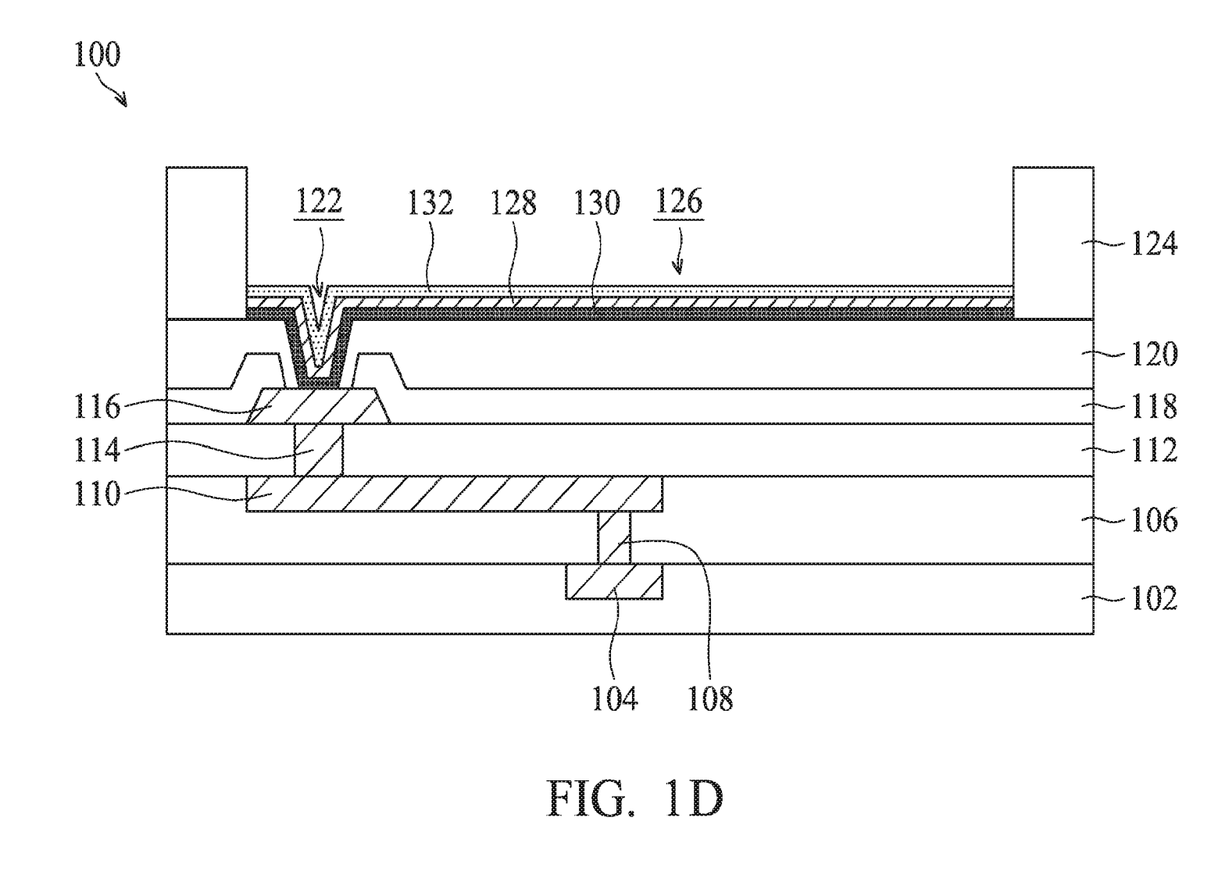

Referring to FIG. 1D, a diffusion barrier layer 132 is deposited on the PPI layer 128, including partially filling the remaining portion of the opening 122. In some embodiments, the diffusion barrier layer 132 is a nickel layer. Alternatively, the diffusion barrier layer 132 is formed of electroless nickel electroless palladium (ENEP), electroless nickel electroless palladium immersion gold (ENEPIG), tantalum or tantalum nitride, or the like. The diffusion barrier layer 132 may be formed by any suitable method such as plating, electroless plating, CVD, PECVD, MOCVD, PVD, ALD or the like. In some embodiments, the diffusion barrier layer 132 has a thickness ranging from about 0.15 μm to about 10 μm. In some embodiments, the photoresist 124 are removed after the formation of diffusion barrier layer 132.

Figure 1E:
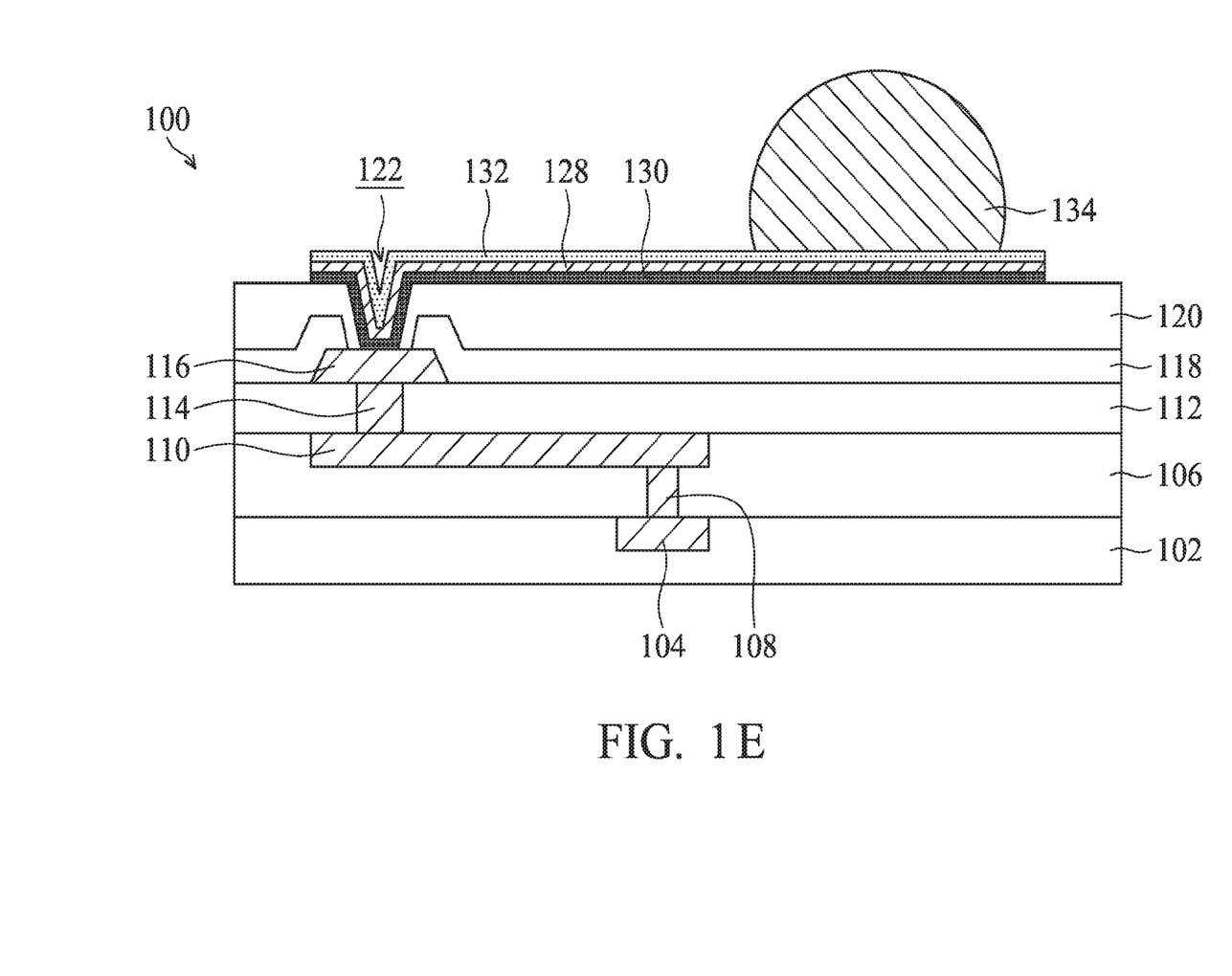

Referring to FIG. 1E, a bump 134 is placed over the PPI layer 128 and outside of the opening 122. That is, the bump 134 is placed over a flat portion of the PPI layer 128. The diffusion barrier layer 132 is located between a bottom of the bump 134 and the PPI layer 128. In some embodiments, the bump 134 is a solder bump. The solder bump may include a lead-free pre-solder layer, SnAg, or a solder material including alloys of tin, lead, silver, copper, nickel, bismuth, or combinations thereof. In some other embodiments, the bump 134 is a copper bump. The copper bump may not form the intermetallic compound with the conductive material of the PPI layer 128. The bump 134 may have a diameter greater than about 200 μm. The bump 134 may be placed over the PPI layer 128 by any suitable method, such as printing or plating.

Figure 1F:
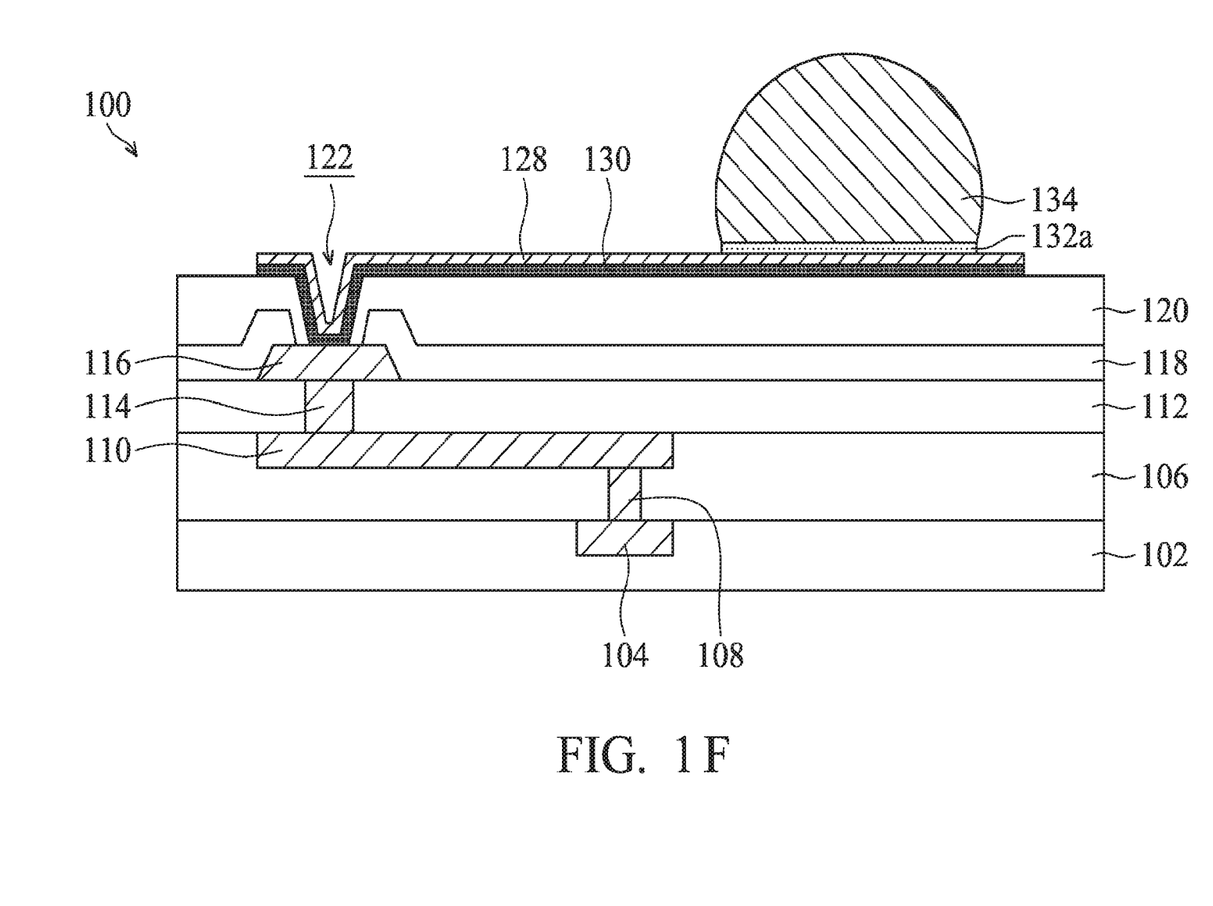

Afterwards, referring to FIG. 1F, the diffusion barrier layer 132 is patterned to form a patterned barrier layer 132a by using the bump 134 as a mask. Accordingly, the patterned diffusion barrier layer 132a has a width not greater than the bottom of the bump 134. For example, the width difference between the patterned diffusion barrier layer 132a and the bottom of the bump 134 may be in a range from 0 to about 3 μm. The diffusion barrier layer 132 is patterned by using an etching process. In some embodiments, the diffusion barrier layer 132 (e.g., nickel layer) is ferromagnetic and can induce electromagnetic interference with underlying electronic components in the semiconductor device 100. As such, the patterned diffusion barrier layer 132a with a reduced width may reduce or avoid the electromagnetic interference. In some other embodiments, the diffusion barrier layer 132 is not patterned if there is no need to be concerned about electromagnetic interference.

Figure 1G:
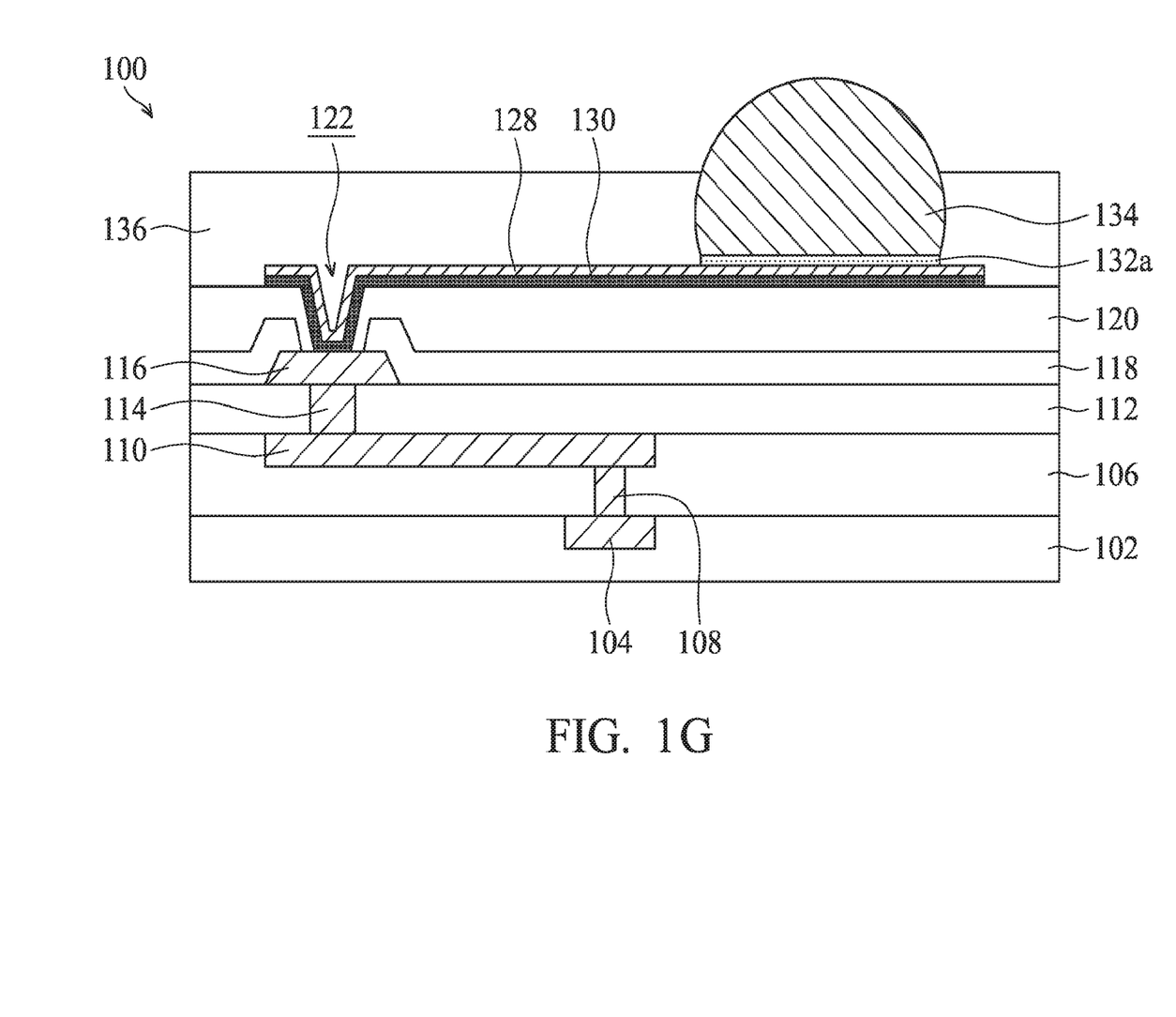

Afterwards, referring to FIG. 1G, a molding compound layer 136 is applied on the PPI layer 128, where the bump 134 is partially buried in the molding compound layer 136. In some embodiments, the molding compound layer 136 is in physical contact with a lower portion of the bump 134, while an upper portion of the bump 134 is exposed and protrudes from a top surface of the molding compound layer 136. In some embodiments, the molding compound layer 136 includes various materials, for example, one or more of epoxy resins, phenolic hardeners, silica, catalysts, pigments, mold release agents, or the like. The molding compound layer 136 may be formed by applying a liquid molding compound and performing a curing process to cure and solidify the liquid molding compound. The molding compound layer 136 may be a single layer film or a composite stack.

In the semiconductor device 100, the diffusion barrier layer 132 or 132a physically insulates the bump 134 from the PPI layer 128 while electrically connecting the bump 134 to the PPI layer 128. The diffusion barrier layer 132 or 132a provides effective diffusion resistance to the conductive material of the PPI layer 128. Therefore, the diffusion from the PPI layer 128 to the bump 134 can be reduced or prevented, and the risks of bump crack and interruption of the PPI layer 128 can be reduced.

Figure 2:
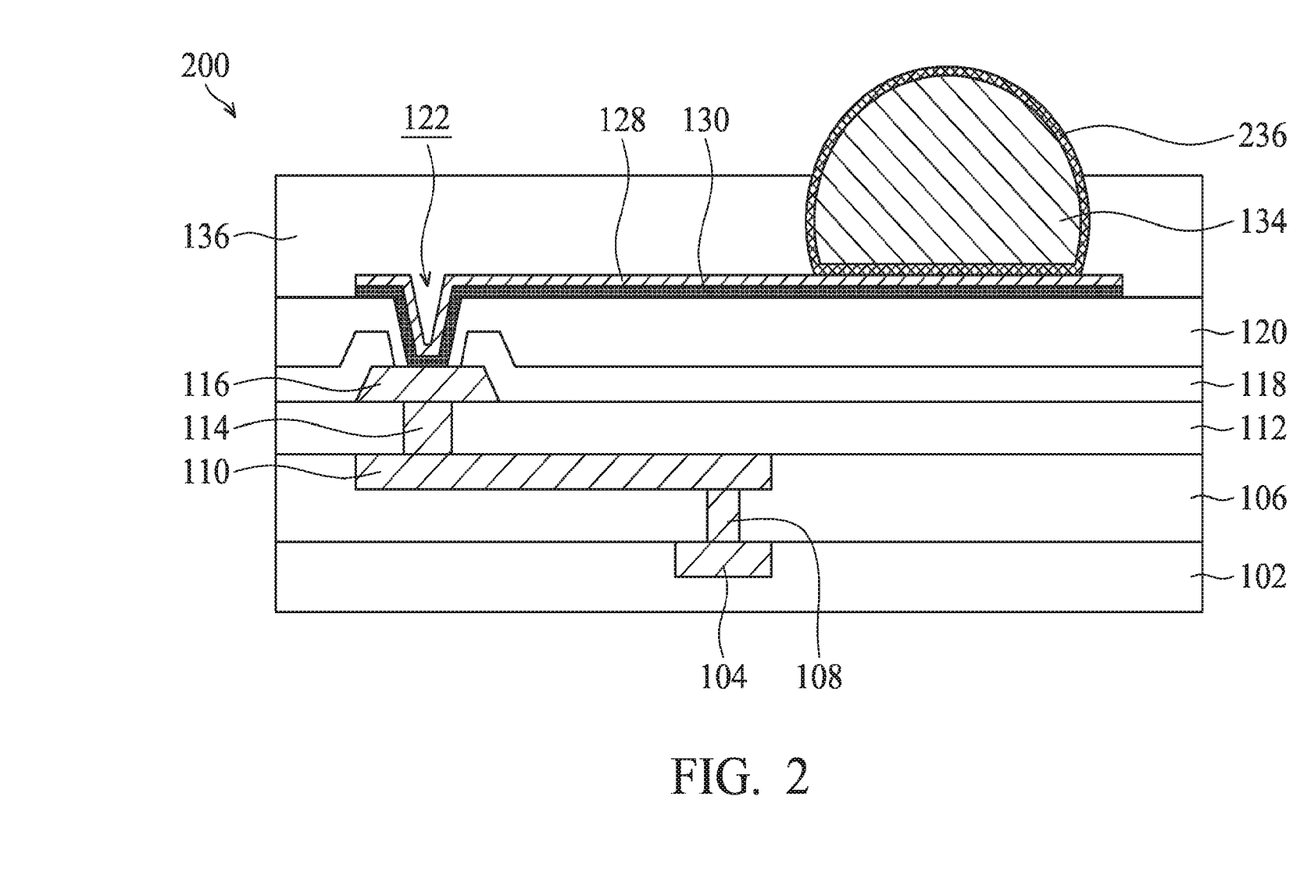
FIGS. 2-4 illustrate cross-sectional views of semiconductor devices, in accordance with alternative embodiments.

FIG. 2 is a cross-sectional view of a semiconductor device 200, in accordance with alternative embodiments. Referring to FIG. 2, the bump 134 is placed over the PPI layer 128 and outside of the opening 122. For example, the bump 134 is placed over the flat portion of the PPI layer 128. In some embodiments, the bump 134 is wrapped by a coating layer 236. The bump 134 and the PPI layer 128 are physically insulated by the coating layer 236. In some embodiments, the coating layer 236 is a nickel layer. Alternatively, the coating layer 236 is formed of electroless nickel electroless palladium (ENEP), electroless nickel electroless palladium immersion gold (ENEPIG), tantalum or tantalum nitride, or the like. The coating layer 236 may be formed by a coating process.

The diffusion barrier layer 132 and the coating layer 236 may be only individually presented or may be simultaneously presented in the semiconductor device 200. For example, as shown in FIG. 2, the bump 134 with the coating layer 236 is directly positioned over the PPI layer 128. Alternatively, the bump 134 with the coating layer 236 is positioned over the diffusion barrier layer 132. The coating layer 236 is coated onto the bump 134 either before or after the placement of the bump 134. In some embodiments, the molding compound layer 136 is applied on the PPI layer 128 after the bump 134 is coated by the coating layer 236 and placed over the PPI layer 128. The coating layer 236 may have a thickness ranging from about 0.15 μm to about 10 μm. The coating layer 236 may provide the same function as the diffusion barrier layer 132 for providing diffusion resistance to the PPI layer 128. Therefore, the coating layer 236 may also be called a diffusion barrier layer.

Figure 3:
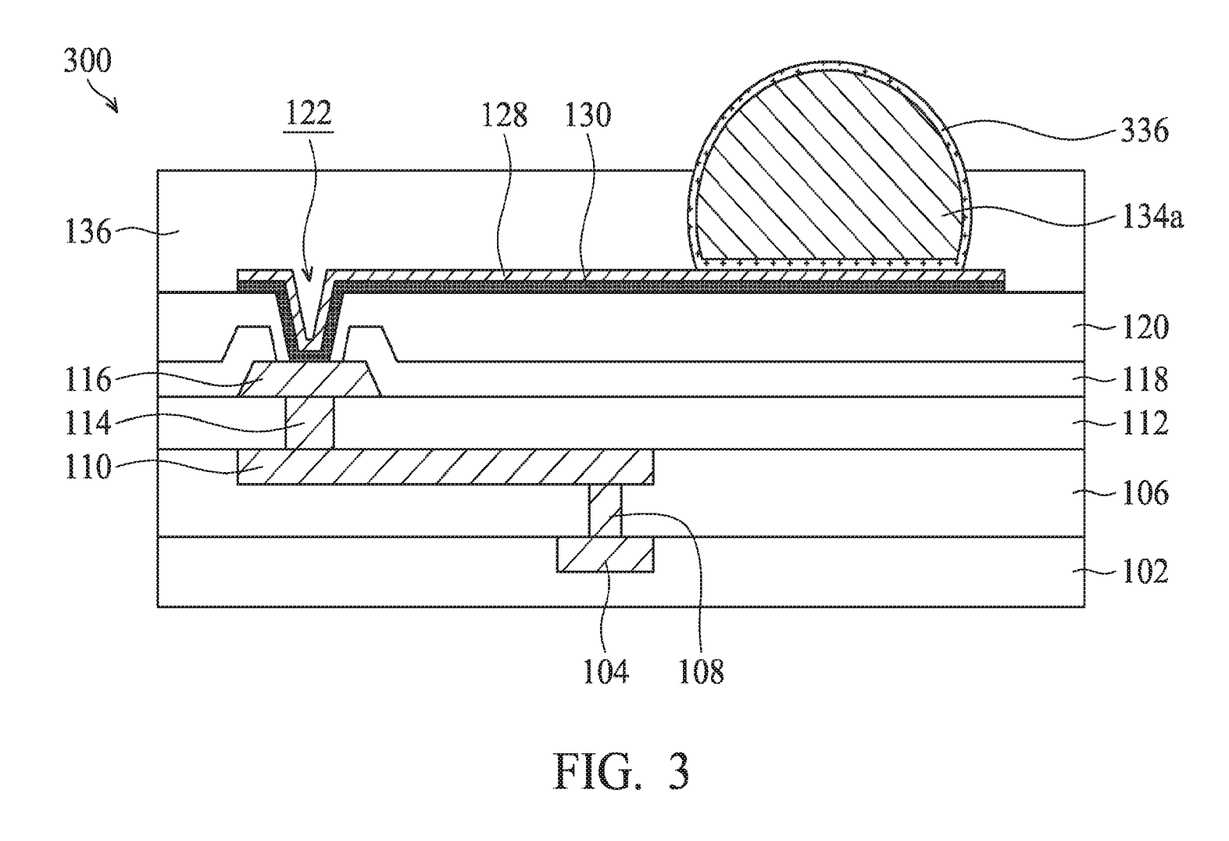

FIG. 3 is a cross-sectional view of a semiconductor device 300, in accordance with exemplary embodiments. Referring to FIG. 3, a bump 134a wrapped by a doped layer 336 is placed over the PPI layer 128 outside of the opening 122. For example, the bump 134a is placed over the flat portion of the PPI layer 128. The bump 134a and the PPI layer 128 are physically insulated by the doped layer 336. In some embodiments, the bump 134a is formed of the same material of the bump 134 and is surrounded by a doped layer 336. The bump 134a may have a diameter greater than about 200 μm. The doped layer 336 may include a dopant such as nickel, iron, nickel-iron alloy, cobalt or the like. The doped layer 336 may be formed by performing an ion implantation process on the bump 134. The implantation process may include providing the bump 134, and then implanting the dopant into a region of the bump 134 near an outer surface of the bump 134.

The diffusion barrier layer 132 and the doped layer 336 may be only individually presented or may be simultaneously presented in the semiconductor device 200. For example, as shown in FIG. 3, the bump 134 with the doped layer 336 is directly positioned over the PPI layer 128. Alternatively, the bump 134 with the doped layer 336 is positioned over the diffusion barrier layer 132. The implantation process of forming the doped layer 336 is performed either before or after the placement of the bump 134. In some embodiments, the molding compound layer 136 is applied on the PPI layer 128 after the bump 134a is wrapped by the doped layer 336 and placed over the PPI layer 128. The doped layer 336 may have a thickness ranging from about 0.15 μm to about 10 μm. The doped layer 336 may provide the same function as the diffusion barrier layer 132 for providing diffusion resistance to the PPI layer 128. Therefore, the doped layer 336 may also be called a diffusion barrier layer.

Figure 4:
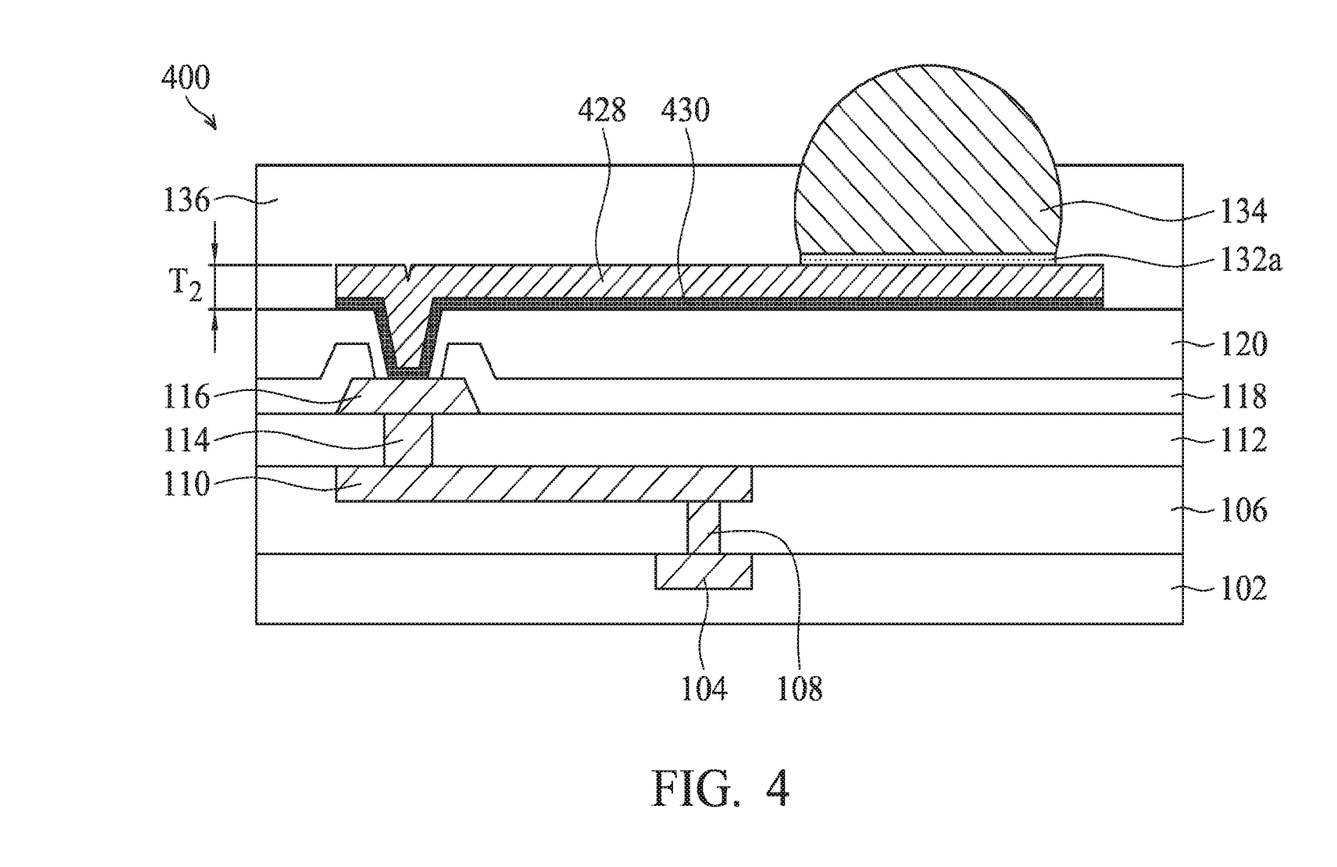

FIG. 4 is a cross-sectional view of a semiconductor device 400, in accordance with exemplary embodiments. The semiconductor device 400 includes a PPI layer 428 that have a thicker thickness than that of the PPI layer 128. For example, the PPI layer 428 has a thickness T2 that ranges from about 2 to 10 times that of the PPI layer 128. For example, the thickness T2 of the PPI layer 428 may be in a range from about 10 μm to about 100 μm. In some embodiments, the PPI layer 428 has a thickness that ranges from about 1/100 to about 1/5 of the diameter of the bump 134. The PPI layer 428, having the thicker thickness T2, can further reduce the possibility of the interruption of the PPI layer 428 as well as at least delay the occurrence of the interruption.

Embodiments of mechanisms for forming a semiconductor device having a post-passivation interconnect structure are provided. A diffusion barrier layer is provided for physically insulating a bump from a post-passivation interconnect layer. Accordingly, the diffusion of a conductive material of the post-passivation interconnect layer can be reduced or prevented. The risks of bump crack and interruption of the post-passivation interconnect layer can be reduced.

In accordance with some embodiments, a semiconductor device is provided. The semiconductor device includes a contact pad over a substrate. The semiconductor device also includes a passivation layer over the substrate and a first portion of the contact pad, and a second portion of the contact pad is exposed through an opening. The semiconductor device further includes a post-passivation interconnect layer over the passivation layer and coupled to the second portion of the contact pad. In addition, the semiconductor device includes a bump over the post-passivation interconnect layer and outside of the opening. The semiconductor device also includes a diffusion barrier layer physically insulating the bump from the post-passivation interconnect layer while electrically connecting the bump to the post-passivation interconnect layer.

In accordance with some embodiments, a semiconductor device is provided. The semiconductor device includes a contact pad over a substrate. The semiconductor device further includes a passivation layer over the substrate and a first portion of the contact pad, and a second portion of the contact pad is exposed through an opening. The semiconductor device further includes a post-passivation interconnect layer over the post-passivation interconnect layer and coupled to the second portion of the contact pad. The post-passivation interconnect layer includes copper. In addition, the semiconductor device includes a bump over the post-passivation interconnect layer and outside of the opening. The semiconductor device also includes a diffusion barrier layer physically insulating the bump from the post-passivation interconnect layer. The diffusion barrier layer includes nickel, electroless nickel electroless palladium (ENEP), electroless nickel electroless palladium immersion gold (ENEPIG), tantalum or tantalum nitride.

In accordance with some embodiments, a method for forming a semiconductor device is provided. The method includes forming a contact pad over a substrate. The method also includes forming a passivation layer over the substrate and a first portion of the contact pad while leaving a second portion of the contact pad exposed through an opening. The method further includes forming a post-passivation interconnect layer over the passivation layer. The post-passivation interconnect layer is coupled to the second portion of the contact pad. In addition, the method includes forming a bump and a diffusion barrier layer over the post-passivation interconnect layer. The bump is outside of the opening and electrically connected to the post-passivation interconnect layer through the diffusion barrier layer.

One general aspect of embodiments disclosed herein includes a semiconductor device, including an integrated circuit; an insulating layer overlying the integrated circuit; a post-passivation interconnect layer over the passivation layer; and a connector electrically connected to the post-passivation layer. The connector includes a bump including a first material, and a diffusion barrier region enclosing the bump and including the first material doped with a dopant.

Another general aspect of embodiments disclosed herein includes a method for forming a semiconductor device, including forming over an integrated circuit a post-passivation interconnect layer; and electrically connecting to the post-passivation interconnect layer a bump. This is accomplished by doping an outer region of the bump with a dopant to form a diffusion barrier region and adhering the bump and diffusion barrier region to the post-passivation interconnect, where the diffusion barrier region physically separates and electrically connects the bump to the post-passivation layer.

Yet another general aspect of embodiments disclosed herein includes a device including: an electrical contact pad; a bump connector; and a diffusion barrier region interjacent the electrical contact pad and the bump connector, where the bump connector includes a first material and the diffusion barrier region includes the first material doped with a dopant.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or layer to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device, comprising:
   an integrated circuit;
   an insulating layer overlying the integrated circuit;
   a post-passivation interconnect layer over the insulating layer;
   a connector electrically connected to the post-passivation interconnect layer, the connector including:
      a bump comprising a first material, and
      a diffusion barrier region enclosing the bump and comprising the first material doped with a dopant, a material composition of the diffusion barrier region being different than a material composition of the bump; and
   a molding compound layer over the post-passivation interconnect layer and around a bottom portion of the connector, wherein a topmost surface of the molding compound layer is disposed at a level between a topmost point of the bump and a bottommost point of the bump, wherein the level of the topmost surface of the molding compound layer is further disposed between a first point of the diffusion barrier region and a second point of the diffusion barrier region, the first point of the diffusion barrier region is above and contacting the topmost point of the bump, the second point of the diffusion barrier region is below and contacting the bottommost point of the bump.

2. The semiconductor device as claimed in claim 1, wherein the dopant in the diffusion barrier region includes nickel.

3. The semiconductor device as claimed in claim 1, wherein the first material includes a solder material or copper.

4. The semiconductor device as claimed in claim 1, wherein a portion of the diffusion barrier region is between a bottom of the bump and the post-passivation interconnect layer.

5. The semiconductor device as claimed in claim 4, further comprising a diffusion barrier layer directly below the diffusion barrier region of the bump and directly above the post-passivation interconnect layer.

6. The semiconductor device as claimed in claim 1, wherein the bump comprises a solder bump.

7. The semiconductor device as claimed in claim 1, wherein the bump comprises copper or copper alloys.

8. The semiconductor device as claimed in claim 1, wherein the post-passivation interconnect layer has a thickness that ranges from about $1/100$ to about $1/5$ of the diameter of the bump.

9. A method for forming a semiconductor device, comprising:
   forming over an integrated circuit a post-passivation interconnect layer;
   forming a diffusion barrier layer over the post-passivation interconnect layer; and
   electrically connecting a bump to the post-passivation interconnect layer by:
      adhering the bump to the diffusion barrier layer;
      after adhering the bump to the diffusion barrier layer, patterning the diffusion barrier layer using the bump as a mask; and
      doping an outer region of the bump with a dopant to form a diffusion barrier region, wherein the diffusion barrier region physically separates and electrically connects an inner region of the bump to the post-passivation interconnect layer through the diffusion barrier layer.

10. The method of claim 9, wherein the diffusion barrier region encloses an entirety of the inner region of the bump.

11. The method of claim 9, wherein the outer region of the bump is doped before the bump is connected to the post-passivation interconnect layer.

12. The method of claim 9, wherein doping the outer region of the bump includes doping the outer region with nickel.

13. A device comprising:
- an electrical contact pad;
- a passivation layer over and contacting a top surface of the electrical contact pad;
- a polymer layer over the passivation layer, wherein the polymer layer extends through the passivation layer to contact the top surface of the electrical contact pad;
- an interconnect over the polymer layer, wherein the interconnect extends through the passivation layer and the polymer layer to contact the top surface of the electrical contact pad;
- a bump connector;
- a diffusion barrier region interjacent the interconnect and the bump connector, wherein the bump connector comprises a first material and the diffusion barrier region comprises the first material doped with a dopant, a material composition of the bump connector being different than a material composition of the diffusion barrier region; and
- a molding compound layer surrounding a portion of the bump connector, wherein a topmost surface of the molding compound layer is disposed at a level between a topmost point of the bump connector and a bottommost point of the bump connector.

14. The device of claim 13, wherein the bump connector is solder and the dopant is nickel.

15. The device of claim 13, wherein the bump connector is copper or a copper alloy and the dopant is nickel.

16. The device of claim 13, wherein the diffusion barrier region surrounds the first material.

17. The device of claim 13, wherein the interconnect has a thickness that ranges from about $\frac{1}{100}$ to about $\frac{1}{5}$ of the diameter of the bump connector.

18. The device of claim 13, wherein the molding compound layer extends above a widest point of the bump connector.

19. The device of claim 13, wherein the molding compound layer extends below a topmost surface of the passivation layer.

* * * * *